United States Patent
Naik et al.

(10) Patent No.: US 9,312,168 B2
(45) Date of Patent: Apr. 12, 2016

(54) AIR GAP STRUCTURE INTEGRATION USING A PROCESSING SYSTEM

(71) Applicant: Applied Materials, Inc., Santa Clara, CA (US)

(72) Inventors: Mehul B. Naik, San Jose, CA (US); He Ren, San Jose, CA (US); Zhenjiang Cui, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/523,523

(22) Filed: Oct. 24, 2014

(65) Prior Publication Data

US 2015/0170956 A1 Jun. 18, 2015

Related U.S. Application Data

(60) Provisional application No. 61/916,726, filed on Dec. 16, 2013.

(51) Int. Cl.
| | |
|---|---|
| *H01L 21/4763* | (2006.01) |
| *H01L 21/768* | (2006.01) |
| *H01L 21/311* | (2006.01) |
| *C23C 16/30* | (2006.01) |

(Continued)

(52) U.S. Cl.
CPC .......... *H01L 21/7682* (2013.01); *C23C 16/303* (2013.01); *C23C 16/36* (2013.01); *H01J 37/32082* (2013.01); *H01L 21/31116* (2013.01); *H01L 21/31138* (2013.01); *H01L 21/76819* (2013.01); *H01L 21/76832* (2013.01); *H01L 21/0217* (2013.01); *H01L 21/02167* (2013.01)

(58) Field of Classification Search
CPC ..................... H01L 21/02167; H01L 21/0217; H01L 21/31116; H01L 21/76819; H01L 21/7682; H01L 21/76832
USPC .................................................. 438/618–641
See application file for complete search history.

(56) References Cited

U.S. PATENT DOCUMENTS

| | | | |
|---|---|---|---|
| 2003/0176075 A1 | 9/2003 | Khan et al. | |
| 2005/0184397 A1* | 8/2005 | Gates et al. | 257/774 |

(Continued)

OTHER PUBLICATIONS

Yoo, et al, "Demonstration of a Reliable High-Performance and Yielding Air gap Interconnect Process," Components Research, Portland Technology Development, Intel Corporation, 2010 IEEE, pp. 1-3.

(Continued)

*Primary Examiner* — H Tsai
(74) *Attorney, Agent, or Firm* — Patterson & Sheridan, LLP

(57) ABSTRACT

A method for forming an air gap structure in an integrated layer stack includes dry etching a mold layer disposed on the stack in a processing system under vacuum. The mold layer is disposed between one or more interconnects, and the process of dry etching of the mold layer exposes at least a portion of the interconnects. The method also includes depositing a liner layer over the exposed portion of the interconnects. In another embodiment, a method for forming an air gap structure in an integrated layer stack includes dry etching an oxide mold layer disposed on the stack in an a first processing chamber in a processing system under vacuum. The method also includes depositing a low-k material liner layer over the interconnects, wherein the liner has a thickness of less than about 2 nanometers. The methods disclosed herein are performed in a processing system without breaking vacuum.

20 Claims, 9 Drawing Sheets

(51) Int. Cl.
*C23C 16/36* (2006.01)
*H01J 37/32* (2006.01)
*H01L 21/02* (2006.01)

(56) References Cited

U.S. PATENT DOCUMENTS

| | | |
|---|---|---|
| 2008/0200026 A1 | 8/2008 | Koh et al. |
| 2009/0130863 A1* | 5/2009 | Toma et al. .......... 438/795 |
| 2011/0104891 A1 | 5/2011 | Al-Bayati et al. |
| 2013/0207267 A1 | 8/2013 | Rho |
| 2013/0252144 A1 | 9/2013 | Su et al. |
| 2013/0323930 A1* | 12/2013 | Chattopadhyay et al. .... 438/703 |

OTHER PUBLICATIONS

Kituchi, et al, "Extremely Non-Porous Ultra-Low-k SiOCH (k=2.3) with Sufficient Modulus (>10; GPa), High Cu Diffusion Barrier and High Tolerance for Integration Process Formed by Large-Radius Neutral-beam Enhanced CVD," 2013 IEEE, pp. 1-3.
International Search Report and Written Opinion for International Application No. PCT/US2014/068344 (APPM/021365PCT) dated Mar. 24, 2015.

* cited by examiner

AIR GAP STRUCTURE INTEGRATION USING A PROCESSING SYSTEM

CROSS-REFERENCE TO RELATED APPLICATIONS

This application claims benefit from U.S. Provisional Patent Application No. 61/916,726, filed Dec. 16, 2013, which is incorporated by reference in its entirety.

BACKGROUND

1. Field

Embodiments of the present disclosure generally relate to the formation of a dielectric layer structure that includes an air gap structure using an integrated processing system.

2. Description of the Related Art

Integrated circuits have evolved into complex devices that can include millions of components (e.g., transistors, capacitors and resistors) on a single chip. The demand for greater circuit density necessitates a reduction in the dimensions of the integrated circuit components, e.g., sub-micron dimensions and the use of various materials to fabricate devices in order to achieve much faster and better electrical performance, such as materials with higher conductivity used to form metal lines, materials with lower permittivity (low-k) dielectric constant used as an insulating layer, etc. For integrated circuit fabrication, metal interconnects with low resistance, such as copper and aluminum interconnects, provide conductive paths between the integrated circuit components on integrated circuit devices. Generally, metal interconnects are electrically isolated from each other by a dielectric bulk insulating material. At sub-micron dimensions, capacitive coupling potentially occurs between adjacent metal interconnects, which may cause cross talk and/or resistance-capacitance (RC) delay and degrade the overall performance of the integrated circuit.

One method for forming vertical and horizontal interconnects for the integrated circuit components is by a damascene or dual damascene method. Typically, damascene structures have dielectric bulk insulating layers and conductive metal layers, such as low dielectric constant materials and conductive copper layers, stacked on top of one another. Vertical interconnects, i.e., vias, and horizontal interconnects, i.e., trenches are etched into the dielectric bulk insulating layer and the conductive metal layers are subsequently filled into the vias and/or trenches and planarized, such as by a chemical mechanical planarization process (CMP), so that the conducting metal materials are only left in the vias and/or trenches. In the damascene approach, a rather complex dielectric film stack that includes a sequence of hard mask, low-k dielectrics, etch stop layers, air gaps, etc., may be required. To obtain such a stack, via/trench lithography, patterning, and wet cleaning processes are typically required before filing the vias and the trenches with the conductive metal materials.

FIG. 1 depicts an integrated layer stack 100 fabricated by a conventional oxide or low-k material mold wet etching removal technique used to form at least part of an interconnect structure on a surface of a semiconductor substrate 101. The integrated layer stack 100 is fabricated by a blanket mold film (not shown) deposited over a low-k dielectric material disposed on the substrate 101. The mold film is patterned to selectively remove portions of the mold film layer to form a trench therein. A barrier layer 104 is deposited over the patterned low-k dielectric material 106, and a conductive material 102 is deposited in the trench over the barrier layer 104. The barrier layer 104 is configured to prevent diffusion between the conductive material 102 and the adjacent flowable low-k dielectric material 106. A chemical mechanical planarization process is then performed to polish back the mold oxide and the barrier layer 104 to expose a top surface of the conductive material 102. A wet etching technique removes the remaining mold film to form the integrated layer stack 100 shown in FIG. 1. Subsequently, an air gap structure 110 is formed between the first flowable low-k material 106 and a second flowable low-k material 108.

Conventional wet etching techniques, however, are problematic, because etchants used to remove the mold layer (not shown), such as hydrofluoric acid (HF) or dilute HF, may damage the barrier layer 104 as shown in region 112. Additionally, the wet etching may over-etch or attack the conductive material 102, as shown in region 114 where the conductive material 102 is recessed.

Additionally, long queue times at ambient conditions between the mold wet etching step and subsequent processes, such as air gap formation, may oxidize the barrier layer 104 and the conductive material 102. Therefore, there is a need for an improved interconnect formation process that does not etch or physically damage the conductive material 102 and barrier layer 104, and will further prevent the oxidation of the conductive material 102 and the barrier layer 104 during the formation process.

SUMMARY

In one embodiment, a method for forming an air gap structure in a integrated layer stack includes dry etching a mold layer disposed on the integrated layer stack in a processing system under vacuum. The mold layer is disposed between one or more interconnects, and the process of dry etching of the mold layer exposes at least a portion of the one or more of the interconnects. The method also includes depositing a liner layer over the exposed portion of the one or more interconnects. The method disclosed herein is generally performed in the processing system without breaking vacuum.

In another embodiment, a method for forming an air gap structure in a integrated layer stack includes dry etching an mold layer disposed on the integrated layer stack in a first processing chamber in a processing system under vacuum. The mold layer is disposed between one or more copper interconnects, and the process of dry etching of the mold layer exposes at least a portion of the one or more of the interconnects. The method also includes depositing a low-k material liner layer having a thickness of less than about 2 nanometers over the exposed portion of the one or more interconnects in a second processing chamber in the processing system under vacuum. The method is performed in the processing system without breaking vacuum.

In yet another embodiment, a method for forming a dielectric structure on a substrate in a processing system includes dry etching a mold layer on the substrate in a first processing chamber under vacuum. The mold layer is disposed between one or more copper interconnects and the process of dry etching of the mold layer exposes at least a portion of the one or more of the interconnects. The method also includes transferring the substrate from the first processing chamber to a second processing chamber under vacuum. The method further includes depositing a liner layer over the exposed portion of the one or more interconnects on the substrate in the second processing chamber under vacuum. The method also includes depositing one or more dielectric layers and a sacrificial layer on the liner layer formed on the substrate in the second processing chamber under vacuum.

BRIEF DESCRIPTION OF THE DRAWINGS

So that the manner in which the above recited features of the present disclosure can be understood in detail, a more particular description of embodiments of the present disclosure, briefly summarized above, may be had by reference to embodiments, some of which are illustrated in the appended drawings. It is to be noted, however, that the appended drawings illustrate only typical embodiments of the present disclosure and are therefore not to be considered limiting of its scope, for the present disclosure may admit to other equally effective embodiments.

DETAILED DESCRIPTION

In the following description, for purposes of explanation, numerous specific details are set forth in order to provide a thorough understanding of embodiments of the present disclosure. In some instances, well-known structures and devices are shown in block diagram form, rather than in detail, in order to avoid obscuring embodiments of the present disclosure. These embodiments are described in sufficient detail to enable those skilled in the art to practice embodiments of the present disclosure, and it is to be understood that other embodiments may be utilized and that logical, mechanical, electrical, and other changes may be made without departing from the scope of the present disclosure.

Embodiments described herein generally relate to air gap structure integration methods using a process system. More specifically, embodiments of the present disclosure relate to mold layer etching processes and liner deposition processes that are integrated within a processing system for an improved air gap structure formation process. Embodiments of the present disclosure generally relate to the formation of a dielectric containing layer structure that includes an air gap structure using a processing system 800 with one or more processing chambers 200, 300. The processing system advantageously forms the dielectric containing layer structure without a "break in vacuum" in the processing system 800, and therefore, forms an electrically robust structure because materials in the dielectric containing layer structure are not oxidized or attacked during the formation process. Details of the processing system 800 and the processing chambers 200, 300 will be discussed further below.

Figure 4:
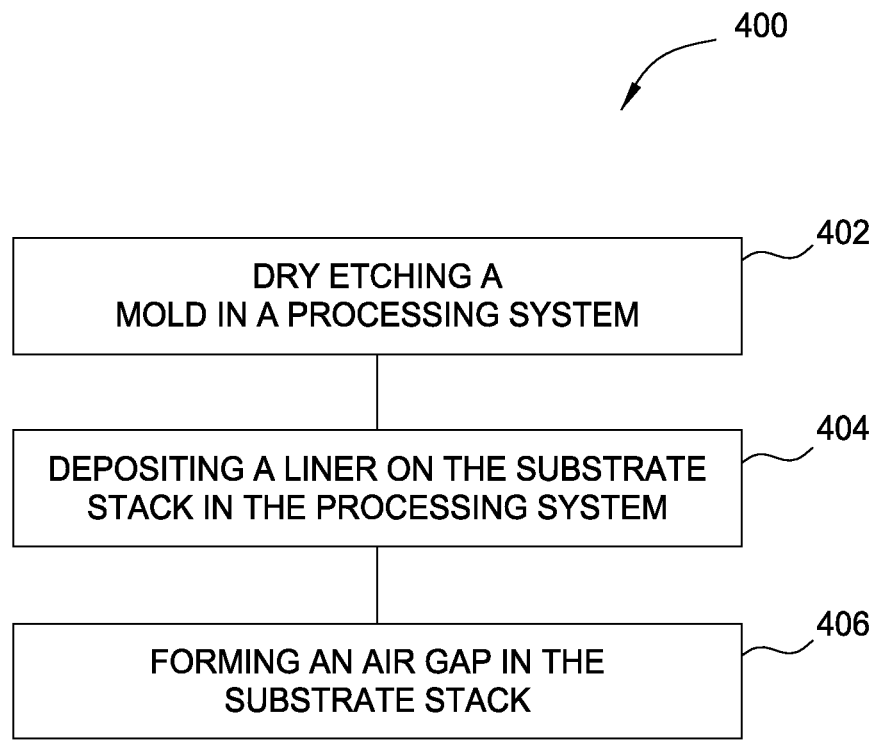
FIG. 4 illustrates a flow diagram for a method for forming an interconnect structure that contains an air gap structure.

FIG. 4 illustrates a flow diagram for a method 400 for forming an air gap structure according to one embodiment of the present disclosure. FIGS. 5A-5D illustrate schematic, cross-sectional views of an integrated layer stack 500 according to one embodiment of the present disclosure.

Figure 5A:
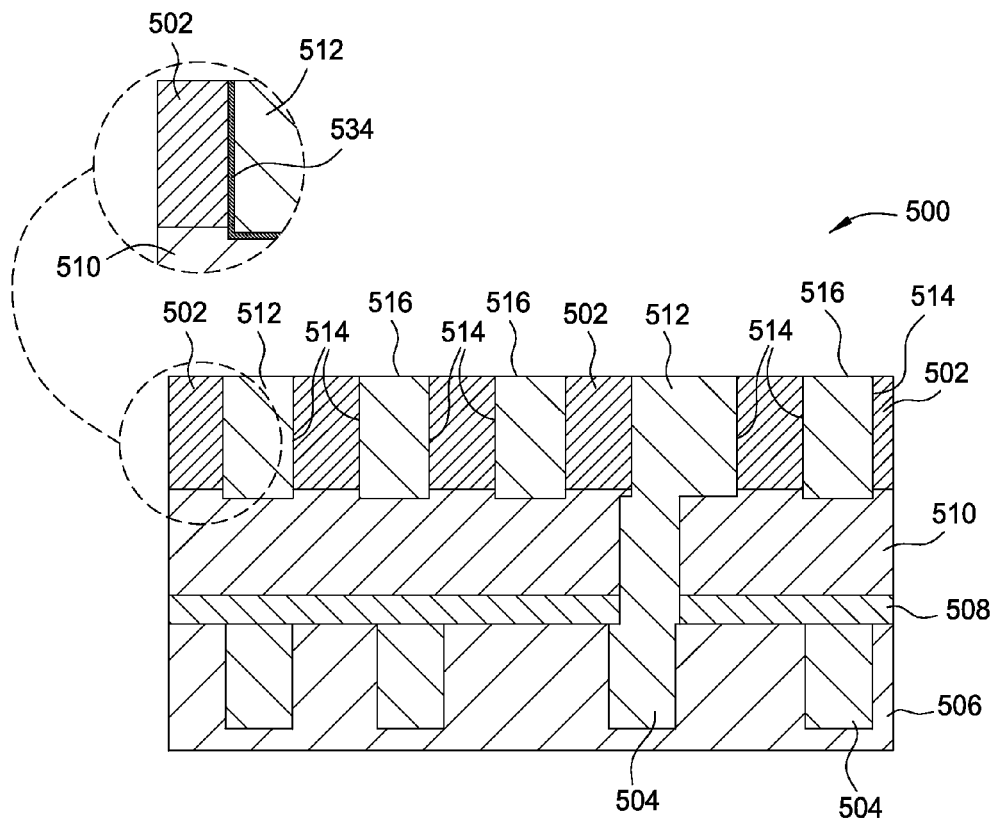
FIGS. 5A-5D illustrate schematic, cross-sectional views of an integrated layer stack during different phases of an interconnect structure formation process.

Referring to FIGS. 4 and 5A-5D, the method 400 begins at block 402 by dry etching or removing a mold layer 502 from the integrated layer stack 500. As shown in FIG. 5A, the integrated layer stack 500 is a damascene structure that includes a conductive material 504 disposed in a first low-k dielectric material 506. In one embodiment, the conductive material 504 is a metal such as copper, and the first low-k dielectric material 506 may include carbon doped oxides or variants thereof, e.g., fluorinated carbon, nanoclustering silica (NCS), mesoporous oxides, or organic "spin-on" materials, BLACK DIAMOND® film layers, e.g., BD1, BDII and BD3, available from Applied Materials Inc., Santa Clara, Calif. It is contemplated that other suitable low-k dielectric materials, e.g., materials having a dielectric constant of between about 1.5 to about 5 may also be utilized in accordance with the embodiment described herein.

The first low-k dielectric material 506 may be deposited by a spin-on technique, plasma enhanced chemical vapor deposition (PECVD), high density plasma CVD, hybrid-physical CVD (HPCVD), neutral beam enhanced chemical vapor deposition (NBECVD), microwave assisted chemical vapor deposition (CVD), or any other suitable low-k dielectric material deposition technique. A first barrier layer 508 is disposed over the first low-k dielectric material 506 to prevent diffusion of the conductive material 504 therein. The first barrier layer 508 may include silicon nitride, silicon carbon nitride (SiCN), or SiOCN. In one embodiment, the barrier layer 508 may include a combination of an etch stop material, e.g., aluminum nitride (AlN), and silicon nitride, silicon carbon nitride (SiCN), or SiOCN. In yet another embodiment, the barrier layer 508 may include a selective metal cap, e.g., cobalt (Co), with silicon nitride, silicon carbon nitride (SiCN), or SiOCN.

A second low-k dielectric material 510 is disposed over the barrier layer 508. In one embodiment, the second low-k dielectric material 510 may include any of the materials or combination of materials listed above for the first low-K dielectric material 510. Additionally, the second low-k dielectric material 510 may be deposited by any of the techniques listed above for the first low-K dielectric material 510. The conductive material 504 forms one or more interconnects 512 disposed over the second low-k dielectric material 510. In one embodiment, a second barrier layer 534 is disposed between the interconnect 512 and the adjacent second low-k dielectric material 510 and the mold layer 502. The second barrier layer 534, shown in FIG. 5A, may include the same materials as the first barrier layer 508 or barrier materials, such as tantalum or tantalum nitride, or any other suitable materials can be a barrier to copper, e.g., manganese (Mn), manganese nitride (MnN), tungsten (W), or any materials formed from a combination thereof. In one embodiment, the interconnect 512 includes side walls 514 and a top wall 516.

Figure 5B:
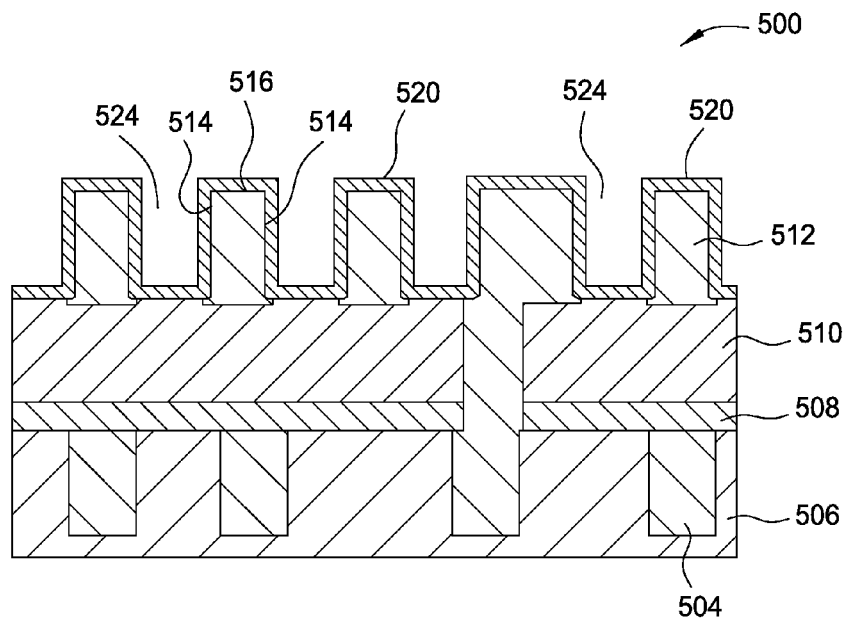
Figure 5C:
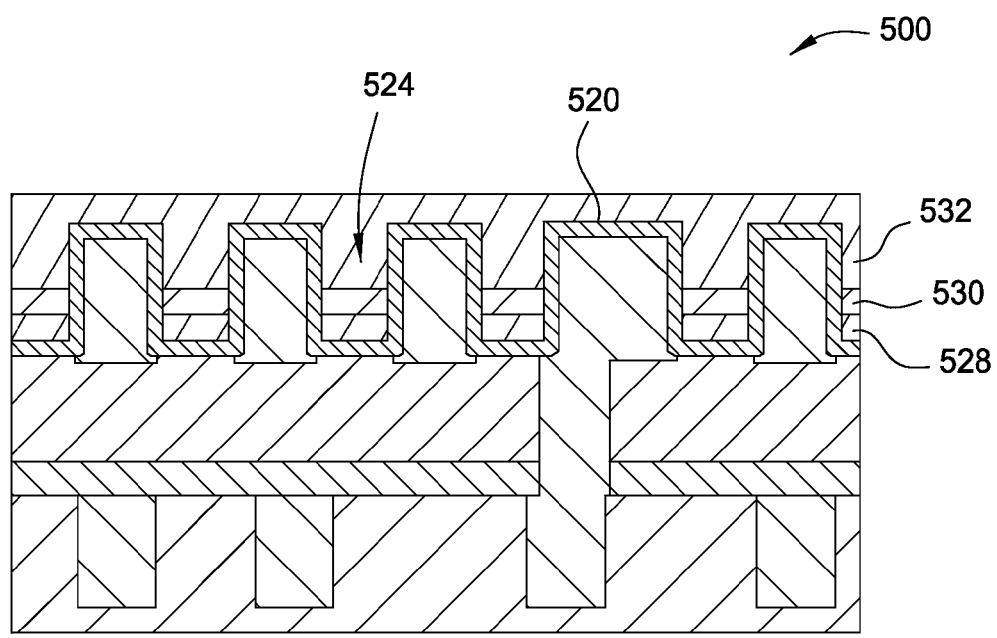
Figure 5D:
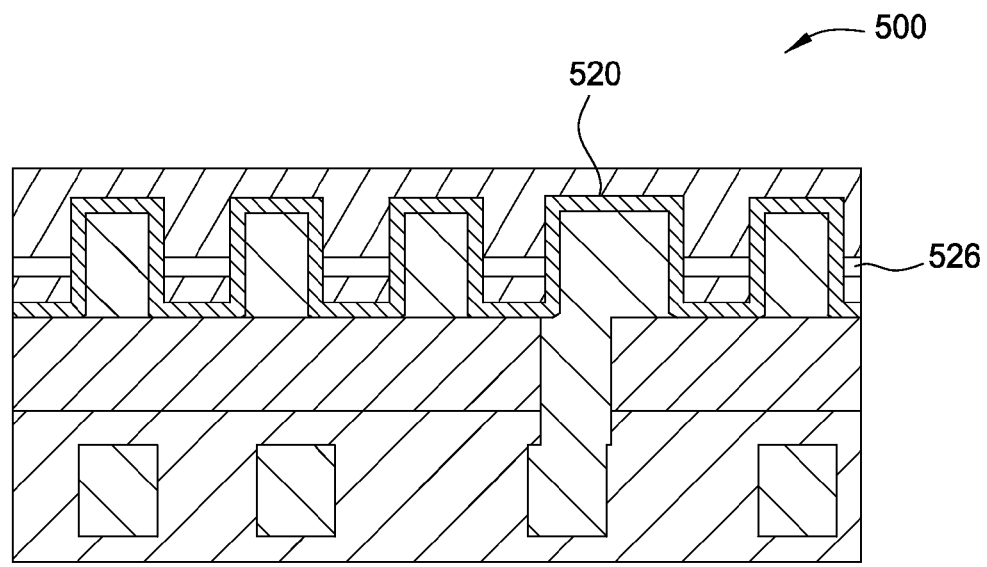

As illustrated in FIG. 5B, the patterned mold layer 502 which was disposed between the interconnects 512 (FIG. 5A) is selectively etched to form an open trench 524 in the first low-k dielectric material 506. In one embodiment, the mold layer 502 is a sacrificial oxide, such as silicon dioxide ($SiO_2$) (formed from a tetraethyl orthosilicate (TEOS) precursor), silane (SiH4), or any other silicon-based oxides, e.g., formed from an organic precursor. In another embodiment, the mold layer is an ultra low-k material, such as carbon, BLACK DIAMOND® film layers, e.g., BD1, BDII and BD3, available from Applied Materials Inc., Santa Clara, Calif. It is contemplated that other suitable low-k dielectric materials, e.g., materials having a dielectric constant of between about 1.5 to about 3 may also be utilized in accordance with the embodiments described herein.

In one example, a dry etching process is performed to remove the mold layer 502, using $NF_3$, $NH_3$ or $C_xF_y$ gases at a process pressure of about 2 mTorr to about 20 mTorr, at a temperature of about 10 to about 80 degrees Celsius and a power of about 0.2 to about 2.0 kW of 13.56 MHz of RF power. Compared to conventional wet etching, dry etching of the mold layer 502 does not isotropically etch, and thus damage neighboring structures, i.e., over-etch or attack the conductive material 504 and damaging the second barrier layer 534. Therefore, diffusion of the conductive material 504 into adjacent films formed thereover is reduced or prevented, which preserves the electrical properties and integrity of the integrated layer stack 500. While a single layer via is shown in FIGS. 5A-5D, in one embodiment, an exclusion mask is used prior to dry etching the mold layer 502, in order to prevent subsequent air gap formation adjacent a next-layer via.

While a specific integrated layer stack structure is discussed herein, it is contemplated that the dry etching of the mold layer 502 at block 402 may be performed on any integrated layer stack suitable for subsequent air gap structure formation. One having ordinary skill in the art will understand that the etching chemistry used at block 402 is selected and adjusted based on the composition and thickness of the mold layer 502. In general, the dry etching process used to etch the mold layer 502 is selected so that it substantially reduces or prevents etching or oxidizing the materials used to form the interconnect 512, and therefore helps maintain the integrity and structure of the interconnect 512.

Dry Etch Process Chamber Example

Figure 1:
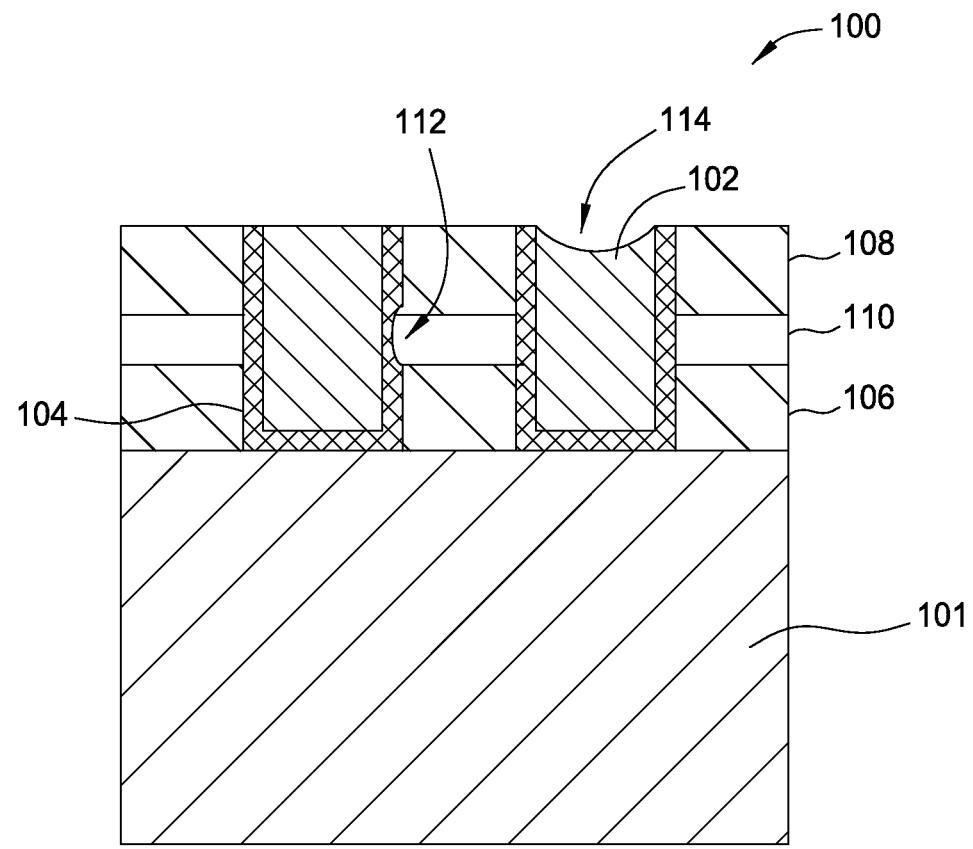
FIG. 1 illustrates a schematic cross-sectional view of an integrated layer stack.
Figure 2:
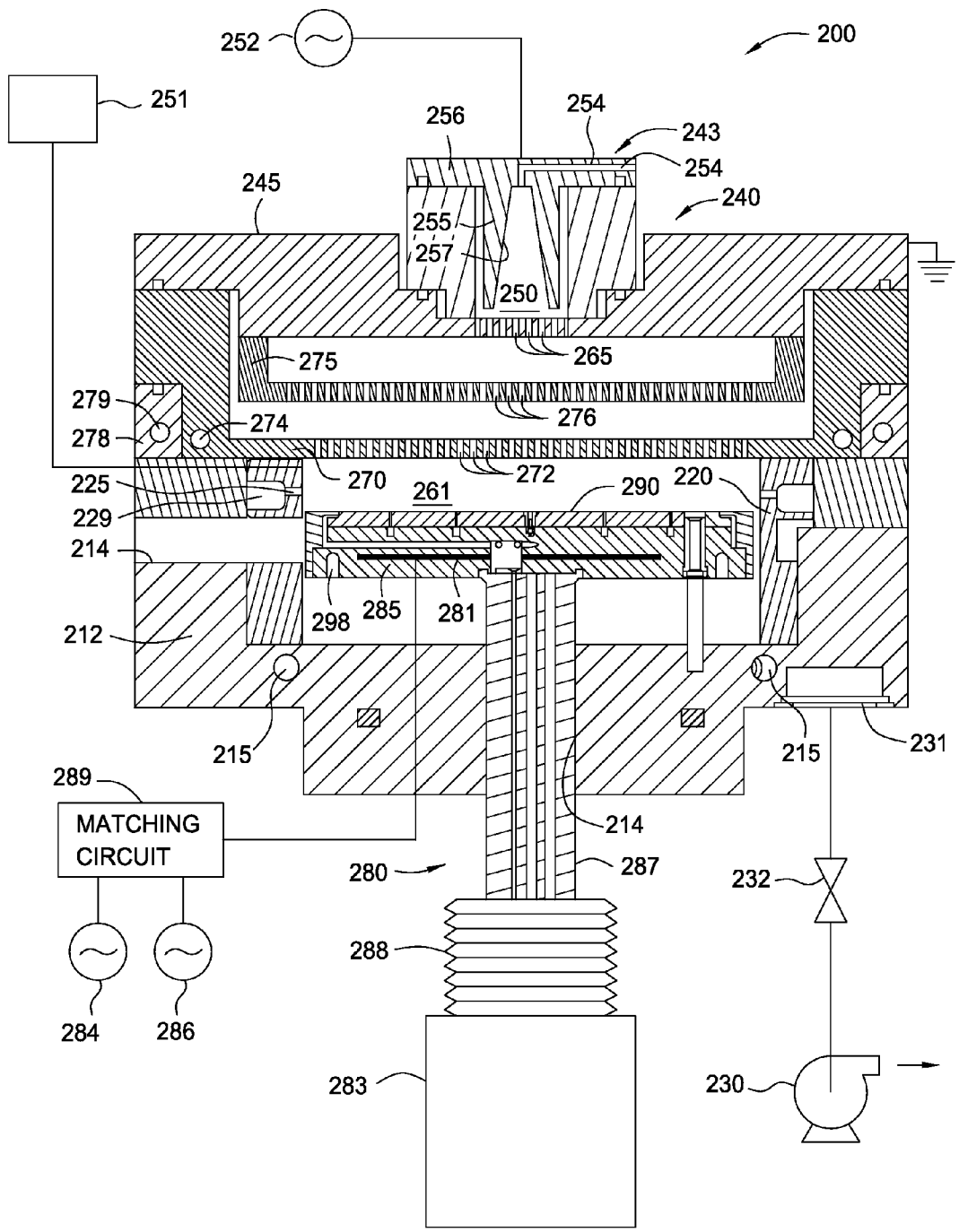
FIG. 2 illustrates a schematic, cross-sectional view of a processing chamber.
Figure 8:
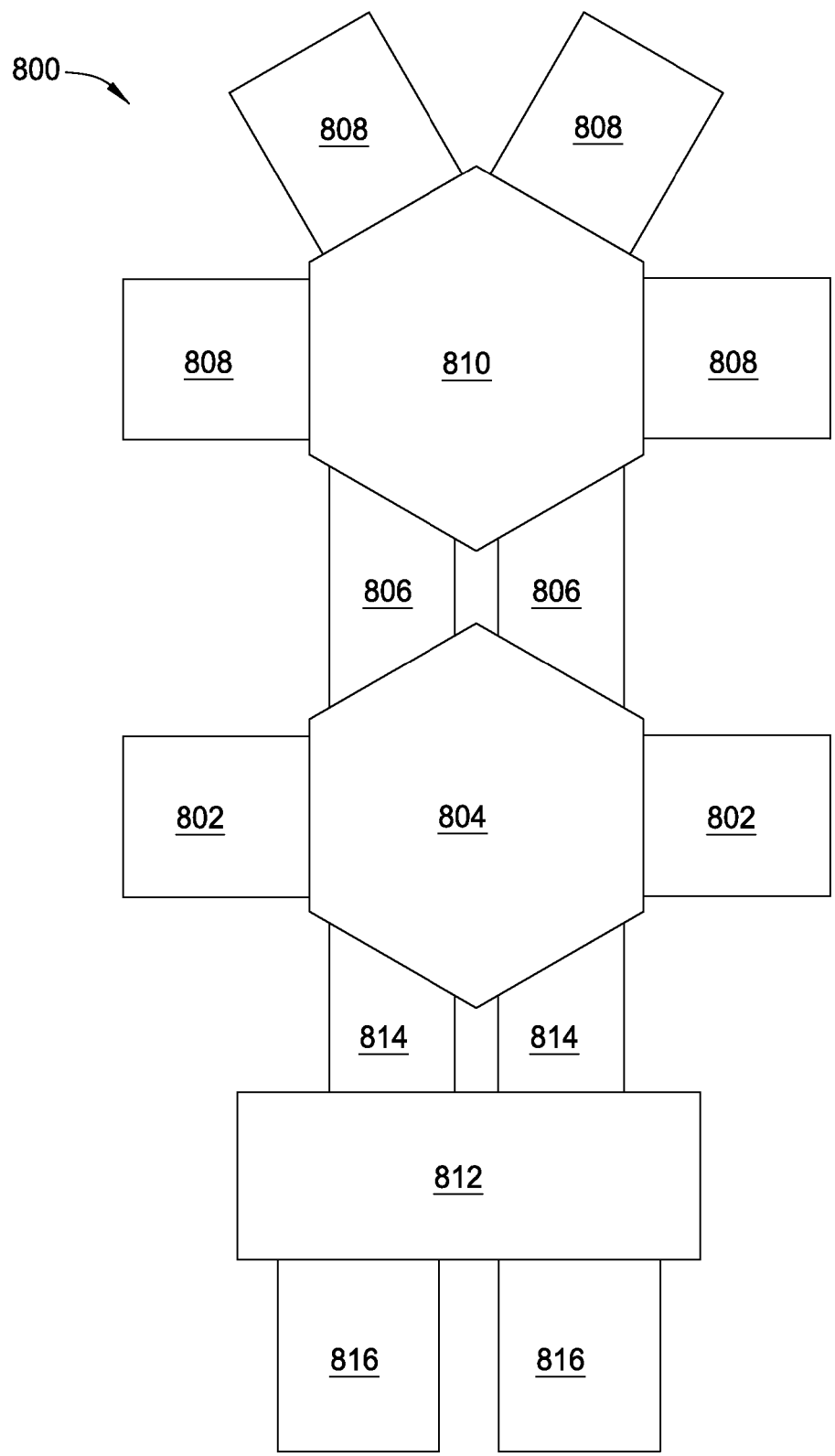
FIG. 8 illustrates a plan view of a processing system. To facilitate understanding, identical reference numerals have been used, where possible, to designate identical elements that are common to the figures. It is contemplated that elements and features of one embodiment may be beneficially incorporated in other embodiments without further recitation.

The dry etching process performed in block 402 may be performed in the chamber 200 in the processing system 800 (See FIG. 8). FIG. 2 is a cross-sectional view of an illustrative processing chamber 200 configured to dry etch or remove a material from an integrated layer stack. The dry etching may include anisotropic etching, isotropic etching, or any combinations thereof. The chamber 200 is particularly suited for dry etching the mold layer 502. Processing chambers 200 suitable for practicing one or more embodiments may include, but are not limited to, the FRONTIER™ processing chamber and the SiCoNi™ processing chamber, both available from Applied Materials, Inc. in Santa Clara, Calif. It is noted that other vacuum processing chambers available from other manufactures may also be adapted to practice the present embodiments.

The processing chamber 200 provides both thermal processing and plasma processing of a substrate surface without breaking vacuum. In one embodiment, the processing chamber 200 includes a chamber body 212, a lid assembly 240, and a support assembly 280. The lid assembly 240 is disposed at an upper end of the chamber body 212, and the support assembly 280 is at least partially disposed within the chamber body 212.

The chamber body 212 includes a slit valve opening 214 formed in a sidewall thereof to provide access to an interior of the processing chamber 200. The slit valve opening 214 is selectively opened and dosed to allow access to the interior of the chamber body 212 by an external substrate handling robot (not shown).

In one or more embodiments, the chamber body 212 includes a channel 215 formed therein for flowing a heat transfer fluid therethrough. The heat transfer fluid can be a heating fluid or a coolant and is used to control the temperature of the chamber body 212 during processing.

The chamber body 212 can further include a liner 220 that surrounds the support assembly 280. The liner 220 is removable for servicing and cleaning. The liner 220 can be made of a metal such as aluminum, a ceramic material, or any other process compatible material. In one or more embodiments, the liner 220 includes one or more apertures 225 and a pumping channel 229 formed therein that is in fluid communication with a vacuum port 231. The apertures 225 provide a flow path for gases into the pumping channel 229, which provides an egress for the gases within the processing chamber 200 to the vacuum port 231.

A vacuum system including a vacuum pump 230 and a throttle valve 232 is coupled to the vacuum port 231 to regulate the flow of gases through the processing chamber 200. The vacuum pump 230 is coupled to a vacuum port 231 disposed in the chamber body 212 and therefore, in fluid communication with the pumping channel 229 formed within the liner 220.

The lid assembly 240 includes at least two stacked components configured to form a plasma volume or cavity therebetween. In one embodiment, the lid assembly 240 includes a first electrode 243 ("upper electrode") disposed vertically above a second electrode 245 ("lower electrode") confining a plasma volume or cavity 250 therebetween. The first electrode 243 is connected to a power source 252, such as an RF power supply, and the second electrode 245 is connected to ground, forming a capacitance between the two electrodes 243, 245.

In one embodiment, the lid assembly 240 includes one or more gas inlets 254 (only one is shown) that are at least partially formed within an upper section 256 of the first electrode 243. The gas inlets 254 are in fluid communication with the plasma cavity 250 at a first end thereof and coupled to one or more upstream gas sources and/or other gas delivery components, such as gas mixers, at a second end thereof.

In one or more embodiments, the first electrode 243 has an expanding section 255 that bounds the plasma cavity 250. In one or more embodiments, the expanding section 255 is an annular member. In one or more embodiments, the expanding section 255 resembles an inverted truncated cone or "funnel." In one or more embodiments, an inner surface 257 of the expanding section 255 gradually slopes from an upper portion to a lower portion of the expanding section 255. As the plasma generated in the plasma cavity 250 is defined in the lid assembly 240 prior to entering into a processing region 261 above the support assembly 280, wherein a substrate (not shown) is disposed during processing. The lid assembly 240 may be considered as a remote plasma source, since the plasma is generated remotely from the processing region 261. In one or more embodiments, various process/carrier gases may be delivered to processing region 261 via a gas source 251. These process/carrier gases are not excited to form a plasma and may be introduced into the process region 261 via a gas source 251.

The expanding section 255 is in fluid communication with the gas inlet 254, and two gas inlets 254 can be disposed at opposite sides of the expanding section 255 to create a swirling flow pattern or "vortex" flow into the expanding section 255 which helps mix the gases within the plasma cavity 250.

The lid assembly 240 can further include a distribution plate 270 and a blocker plate 275 adjacent the second electrode 245. The second electrode 245, the distribution plate 270 and the blocker plate 275 can be stacked and disposed on a lid rim 278 connected to the chamber body 212. The lid rim 278 can include an embedded channel or passage 279 for circulating a heat transfer medium.

In one or more embodiments, the second electrode or top plate 245 can include a plurality of gas passages or apertures 265 formed beneath the plasma cavity 250 to allow gas from the plasma cavity 250 to flow therethrough. The distribution plate 270 is substantially disc-shaped and also includes a plurality of apertures 272 or passageways to distribute the flow of gases therethrough.

In one or more embodiments, the distribution plate 270 includes one or more embedded channels or passages 274 for housing a heater or heating fluid to provide temperature control of the lid assembly 240.

The blocker plate 275 may optionally be disposed between the second electrode 245 and the distribution plate 270. The blocker plate 275 is removably mounted to a lower surface of the second electrode 245. The blocker plate 275 may be in good thermal and electrical contact with the second electrode 245. In one or more embodiments, the blocker plate 275 can be coupled to the second electrode 245 using a bolt or similar fastener. The blocker plate 275 can also be threaded or screwed onto an outer diameter of the second electrode 245. The blocker plate 275 includes a plurality of apertures 276 to provide a plurality of gas passages from the second electrode 245 to the distribution plate 270.

The support assembly 280 can include a support member 285 to support the substrate for processing within the chamber body 212. The support member 285 can be coupled to a lift mechanism 283 through a shaft 287 which extends through a centrally-located opening 214 formed in a bottom surface of the chamber body 212. The lift mechanism 283 can be flexibly sealed to the chamber body 212 by a bellows 288 that prevents vacuum leakage from around the shaft 287. The lift mechanism 283 allows the support member 285 to be moved vertically within the chamber body 212 between a process position and a lower transfer position. In one embodiment, the support member 285 includes a removable top plate 290 made of a silicon or ceramic material, for example, to reduce backside contamination of the substrate.

In one or more embodiments, the substrate (not shown) may be secured to the support member 285 using a vacuum chuck or an electrostatic chuck. An electrostatic chuck typically includes at least a dielectric material that surrounds an electrode 281, which may be located on the support member 285 or formed as an integral part of the support member 285. In one embodiment, the electrode 281 is coupled to a plurality of RF bias power sources 284, 286. The dual RF bias power sources 284, 286 are coupled to the electrode 281 through a matching circuit 289. The RF bias power sources 284, 286 are generally capable of producing an RF signal having a frequency of from about 50 kHz to about 200 MHz and a power between about 0 Watts and about 5000 Watts. Additional bias power sources may be coupled to the electrode 281 to control the characteristics of the plasma as needed.

The temperature of the support assembly 280 can be controlled by a fluid circulated through a fluid channel 298 embedded in the body of the support member 285.

A system controller (not shown) can be used to regulate the operations of the processing chamber 200. The system controller can operate under the control of a computer program stored on a memory of a computer. The computer program may include instructions that enable the process described below to be performed in the processing chamber 200. For example, the computer program can dictate the process sequencing and timing, mixture of gases, chamber pressures, RF power levels, susceptor positioning, slit valve opening and closing, substrate cooling and other parameters of a particular process.

Referring back to FIGS. 4 and 5A-5D, at block 404, the method 400 includes depositing a liner 520 over the interconnect 512 in the chamber 300 in the processing system 800. The liner 520 may be deposited by atomic layer deposition (ALD), CVD, HPCVD, high density plasma CVD, remote plasma CVD, microwave assisted CVD, NBECVD or plasma enhanced atomic layer deposition (PEALD) wherein the terms ALD, CVD, HPCVD, NBECVD, PEALD refer to the sequential introduction of reactants or precursors to deposit a layer over a substrate structure, or any other suitable deposition process. In the embodiment shown in FIG. 5B, the liner 520 is a conformal liner deposited by an ALD process over the side walls 514 and the top wall 516 of the interconnect 512.

In one embodiment, the liner 520 is a dielectric liner configured to prevent oxidation of the interconnect 512 and minimize the capacitive coupling between the adjacent interconnects 512 (e.g., damascene traces). In one embodiment, the desired capacitance between the interconnects 512 is achieved by selecting a liner material that has a low dielectric constant. For example, the liner is selected from dielectric materials that include carbides, nitrides and silane, such as silicon carbon nitride (SiCN), or any suitable combinations thereof, and/or other useful low dielectric constant materials. In one example, the liner deposition process performed at block 404 includes providing trimethylsilane gas at a process pressure of about 3.7 Torr, at a temperature of about 350 degrees Celsius, at a power of about 700 W of 13.56 MHz of RF power for about 10 seconds to deposit about 20 Angstroms (Å) of SiCN material.

In another embodiment, the desired capacitance is achieved by depositing the liner 520 that has a more conventional dielectric constant at a thickness of less than about 4 nanometers, for example less than about 2 nanometers, or less than about 1 nanometer, but greater than at least a monolayer in thickness. In one embodiment, the liner 520 is selected from conventional dielectric materials such as silicon nitride (SiN) or aluminum nitride (AlN), or any other suitable combinations thereof, and/or other useful dielectric materials. In one example, the liner deposition process performed at block 404 includes providing SiH4 or NH3 gases at a process pressure of about 3.5 Torr, at a temperature of about 350 degrees Celsius, at a power of about 75 W of 13.56 MHz of RF power for about 5 seconds to deposit about 20 Angstroms (Å) of SiN material. In yet another embodiment, the desired capacitance may be achieved by a combination of optimal liner material and thickness.

Liner Deposition Chamber Example

Figure 3:
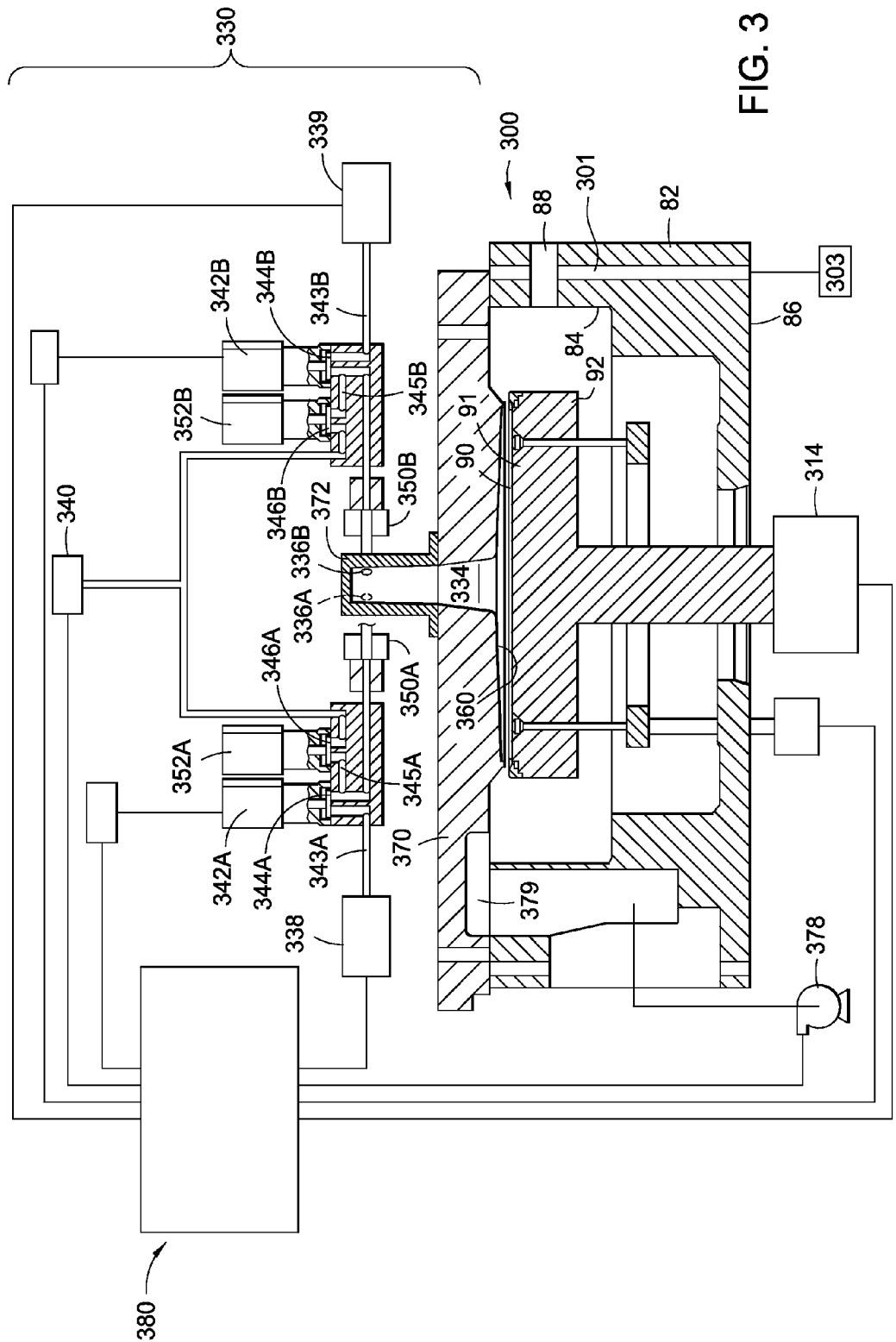
FIG. 3 illustrates a schematic, cross-sectional view of a processing chamber.

The liner deposition process performed in block 404 may be performed in a chamber similar to chamber 300 illustrated in FIG. 3. In general, chamber 300 is suitable for depositing liners on an integrated layer stack and includes a gas delivery apparatus 330 adapted for cyclic deposition, such as ALD, CVD, HPCVD, PEALD, PECVD, microwave assisted CVD or NBECVD. The sequential introduction of precursors may be repeated to deposit a plurality of thin layers to form a conformal layer to a desired thickness.

The processing chamber 300 comprises a chamber body 82 having side walls 84 and a bottom 86. The side walls 84 may include fluid channels 301 coupled to a fluid source 303 for heating and cooling the side walls. A slit valve 88 in the processing chamber 300 provides access for a robot (not shown) to deliver and retrieve a substrate 90 from the processing chamber 300.

A substrate support 92 supports the substrate 90 on a substrate receiving surface 91 in the processing chamber 300. The substrate support 92 is mounted to a lift motor 314 to raise and lower the substrate support 92 and the substrate 90 disposed thereon. The substrate support 92 may be heated to increase the temperature of a substrate 90 disposed thereon. The gas delivery apparatus 330 is disposed at an upper portion of the chamber body 82 to provide a gas, such as a process gas and/or a purge gas, to the chamber 80. A vacuum system 378 is in communication with a pumping channel 379 to evacuate any desired gases from the processing chamber 300 and to help maintain a desired pressure in the processing chamber 300.

In one embodiment, the processing chamber 300 allows process gas and/or purge gas to enter the processing chamber 300 normal (i.e., 90 degrees) with respect to the plane of the substrate 90 via the gas delivery apparatus 330. Therefore, the surface of substrate 90 is symmetrically exposed to gases that allow uniform film formation on substrates.

In one embodiment, the gas delivery apparatus 330 comprises a processing chamber lid 370. The chamber lid 370 includes an expanding channel 334 extending from a central portion of the chamber lid 370 and a bottom surface 360 extending from the expanding channel 334 to a peripheral portion of the chamber lid 370. The expanding channel 334 has gas inlets 336A, 336B to provide gas flows from two similar pairs of valves 342A/352A, 342B/352B.

In one configuration, the valves 342A, 342B are coupled to separate precursor gas sources and may be coupled to the same purge gas source. For example, the valve 342A is coupled to a first precursor gas source 338 and the valve 342B is coupled to a second precursor gas source 339, and both valves 342A, 342B are coupled to a purge gas source 340. Each valve 342A, 342B includes a delivery line 343A, 343B having a valve seat assembly 344A, 344B and each valves 352A, 352B includes a purge line 345A, 345B having a valve seat assembly 346A, 346B. The delivery line 343A, 343B is in communication with the first and second precursor gas source 338, 339 and is in communication with the gas inlet 336A, 336B of the expanding channel 334. The valve seat assembly 344A, 344B of the delivery line 343A, 343B controls the flow of the precursor gas from the precursor gas source 338, 339 to the expanding channel 334. The purge line 345A, 345B is in communication with the purge gas source 340 and intersects the delivery lines 343A, 343B downstream of the valve seat assembly 344A, 344B of the valves 342A, 342B. The valve seat assembly 346A, 346B of the purge line 345A, 345B controls the flow of the purge gas from the purge gas source 340 to the delivery line 343A, 343B. The delivery lines 343A, 343B of the valves 342A, 342B may be coupled to the gas inlets 336A, 336B through gas conduits 350A, 350B. The gas conduits 350A, 350B may be integrated or may be separate from the valves 342A, 342B.

The expanding channel 334 comprises a channel which has an inner diameter which increases from an upper portion of a cap 372 to a lower portion of the expanding channel 334 adjacent the bottom surface 360 of the processing chamber lid 370. In general, a larger gas flow will require a larger diameter expanding channel.

The above-described processing chamber 300 can be controlled by a processor based system controller such a controller 380. The controller 380 can operate under the control of a computer program stored on a memory of a computer. The computer program may include instructions that enable the process described below to be performed in the processing chamber 300.

Referring back to FIGS. 4 and 5A-5D, at block 406, the method 400 includes forming an air gap structure 526 over the liner 520 formed in the integrated layer stack 500. In one embodiment, the air gap structure 526 is formed by depositing a layer stack that includes a first flowable low-k material 528, a sacrificial film 530, and a second flowable low-k material 532 by using one or more flowable CVD processes over the liner 520 and within the trenches 524 formed in block 402. In one embodiment, the first and second flowable low-k materials 528 and 532 are carbon doped oxides or variants thereof, e.g., fluorinated carbon, NCS, mesoporous oxides, or organic "spin-on" materials, and the sacrificial film 530 includes carbon (C) or a polymeric carbon-hydrogen film. In one embodiment, the liner 520 advantageously protects the copper interconnect 512 from the sacrificial carbon film 530. In an alternative embodiment, the air gap structure 526 is formed by depositing a layer stack that includes only the sacrificial film 530 and the second flowable low-k material 532 by using one or more flowable CVD processes over the liner 520 and within the trenches 524 formed in block 402.

In one embodiment, the first and second flowable low-k materials 528, 532 and the sacrificial film 530 are then cured by a UV or thermal treatment to remove the sacrificial film 530, and thus form the air gap structure 526. However, in the embodiment where the layer stack only includes the sacrificial film 530 and the second flowable low-k material 532, only the sacrificial film 530 and the second flowable low-k material 532 are cured by a UV or thermal treatment to remove the sacrificial film 530, and thus form the air gap structure 526. In one embodiment, the first and second flowable low-k materials 528, 532 and the sacrificial film 530 can be cured at a temperature of less than about 400 degrees Celsius under a UV light using an inert gas, such as He or Ar.

In one embodiment, the second flowable low-k material 532 is polished back, e.g., by a chemical mechanical polishing process, to polish a portion of the liner 520 and expose the top wall 516 of the interconnect 512. A barrier layer (not shown) may be deposited over the top wall 516 before performing a subsequent process, e.g., blanket low-k material deposition. In another embodiment, the flowable low-k material 532 is only partially polished back, and the liner 520 is not polished before performing a subsequent process, e.g., blanket low-k material deposition. Therefore, the unpolished liner 520 on the top wall 516 can be used as a barrier layer to prevent diffusion between the interconnect 512 and the blanket low-k material.

Figure 6A:
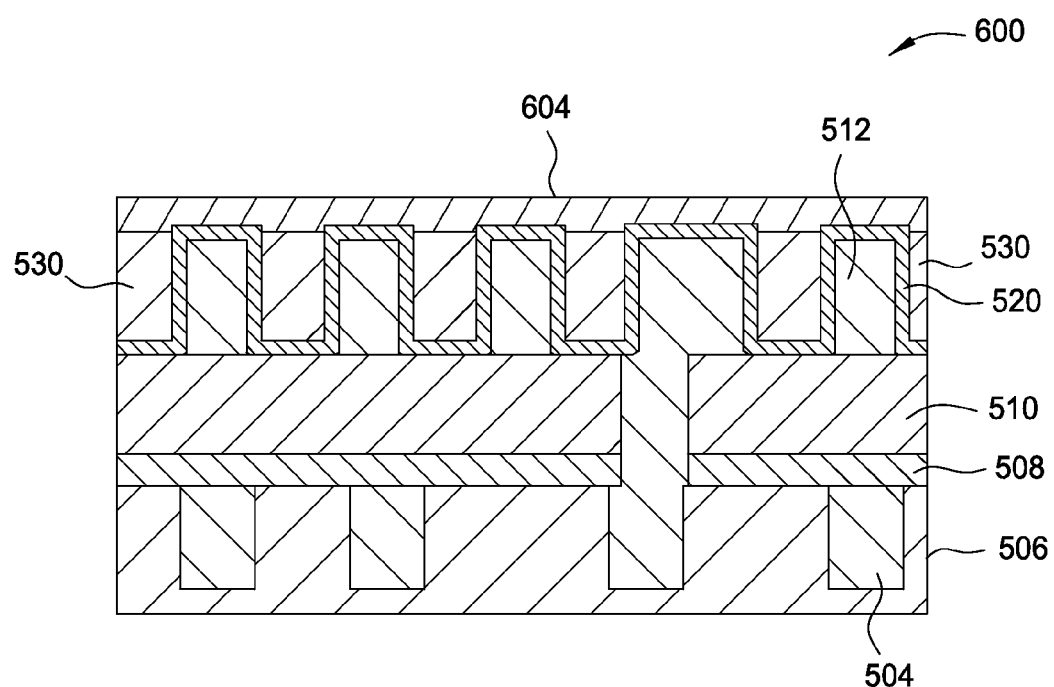
FIGS. 6A-6B illustrate schematic, cross-sectional views of an integrated layer stack during different phases of an interconnect structure formation process.
Figure 6B:
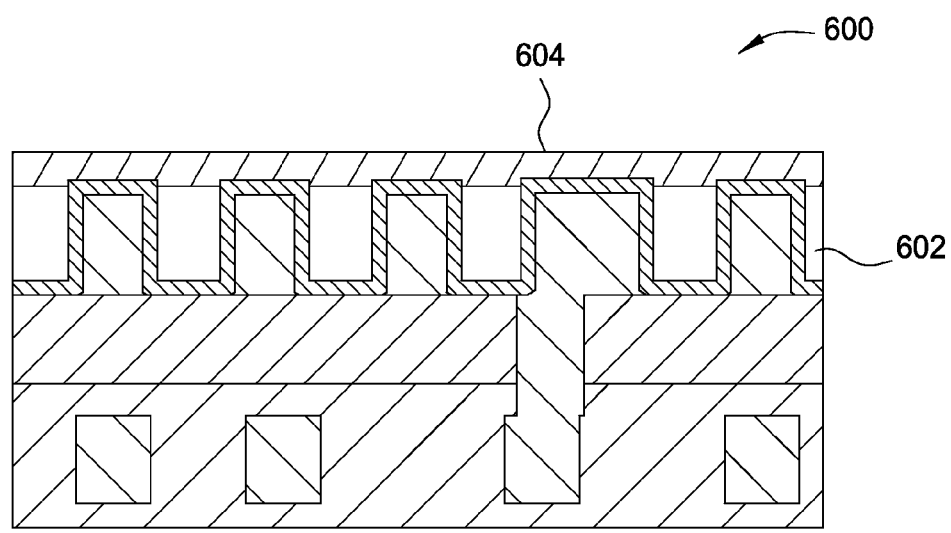

FIGS. 6A-6B illustrate a schematic cross-sectional view of an integrated layer stack 600 according to another embodiment described herein. The integrated layer stack 600 is similar to the integrated layer stack 500. The process of forming the integrated layer stack 600 includes performing operations 402-404, as discussed above. However, in this embodiment of the method 400, block 406 includes forming an air gap structure 602 in the integrated layer stack 600. The air gap structure 602 is formed by depositing a layer stack that includes the sacrificial film 530 and a capping layer 604. The layer stack is formed by first depositing the sacrificial film 530 by a CVD process, e.g., PECVD, over the liner 520 and in the trenches 524. The sacrificial film 530 may include materials as discussed above in references to the integrated layer stack 500. Subsequently, the capping layer 604 is deposited over the sacrificial film 530 by a CVD process, e.g., PECVD. In one embodiment, the capping layer is a porous material, such as SiOCH. The capping layer 604 and the sacrificial film 530 are then cured by a UV or thermal treatment to remove the sacrificial film 530, and thus form the air gap structure 602.

Figure 7:
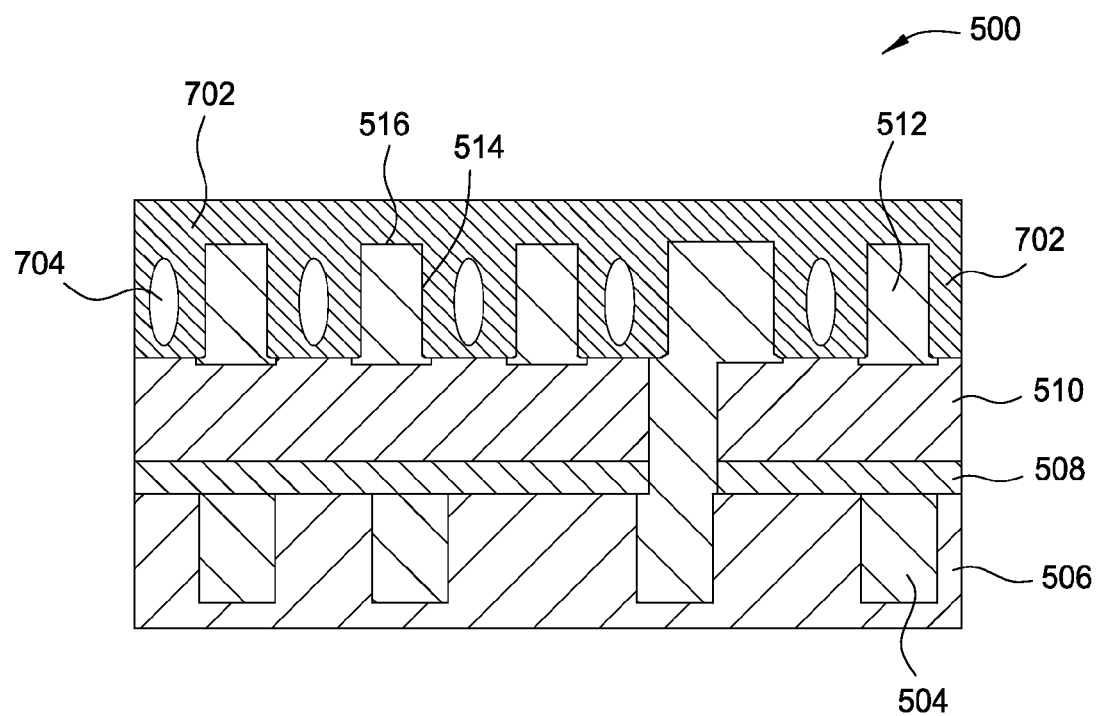
FIG. 7 illustrates a schematic, cross-sectional view of an integrated layer stack.

FIG. 7 illustrates a schematic cross-sectional view of an integrated layer stack 700 according to yet another embodiment. The integrated layer stack 700 is similar to the integrated layer stack 500, however after dry etching the mold layer 502 at block 402, a non-conformal liner 702 is deposited in the trenches 524 at block 404. The non-conformal liner 702 is similar in material to the liner 520, however, the non-conformal liner 702 is deposited to form void air gap structures 704 within the liner 702. The void air gap structures 704 are formed from conventional techniques by depositing the liner 702 at a faster rate near the top wall 516 and a slower rate near the side walls 514 of the interconnect 512, and "pinching off" the deposition near the top wall 516 before the trenches 524 are filled.

Processing System Example

FIG. 8 illustrates a plan view of the processing system 800. In one embodiment, blocks 402 and 404, and at least a portion of block 406, of method 400 are performed in the processing system 800. The processing system 800 is an integrated cluster tool that includes the chambers 200 and 300. In one embodiment, the processing system 800 includes a plurality of first processing chambers 802 coupled to a first transfer chamber 804. In one embodiment, the first processing chamber 802 is the chamber 200, i.e., for dry etching, and the dry etching at block 402 of method 400 are performed in chamber 200. The first transfer chamber 804 is also coupled to one or more first load lock chambers 806. The first transfer chamber 804 has a centrally disposed transfer robot (not shown) for transferring substrates between the processing chambers 802 and the first load lock chambers 806. The processing system 800 also includes a plurality of second processing chambers 808 that are coupled to a second transfer chamber 810. In one embodiment, the second processing chambers 808 include a chamber for a liner deposition, such as the chamber 300, and the liner 520 deposition performed at block 404 and the layer stack deposition process performed at block 406 are performed in the chamber 300. One such suitable chamber may be the CENTINEL™ chamber from Applied Materials, Inc. in Santa Clara, Calif.

The second processing chambers 808 also include a chamber for a layer stack deposition. For example, the first and second flowable low-k materials 528, 532 are deposited in a first processing chamber 802, and the sacrificial film 530 is deposited in a second processing chamber 808. In another embodiment, the capping layer 604 and the sacrificial film 530 are deposited in the same processing chamber 808. One such suitable chamber may be the ETERNA™ chamber available from Applied Materials, Inc., in Santa Clara, Calif. The second transfer chamber 810 also has centrally disposed transfer robot (not shown) for transferring substrates between the processing chambers 808 and the first load lock chambers 806. A factory interface 812 is connected to the first transfer chamber 804 by the second load lock chambers 814. The factory interface 812 is coupled to one or more pods 816 on an opposite side of the second load lock chambers 814. The pods 816 are typically front opening unified pods (FOUP) that are accessible from a clean room side. While the first processing chambers 802 are shown as the chamber 200 and the second processing chambers 808 are shown as the chamber 300, it is contemplated any combination of chambers may be used to maximize the throughput of the substrates with minimum queue time.

In one embodiment, the processing system 800 is a CENTURA® or an ENDURA® platform, both available from Applied Materials, Inc. in Santa Clara, Calif. It is noted that other processing systems available from other manufactures may also be adapted to practice one or more embodiments described herein.

The dry etching and liner deposition processes of blocks 402 and 404, and the layer stack deposition process of block 406 are performed in the processing system 800 "without breaking vacuum". "Without breaking vacuum", as used herewithin, refers to the process of transferring the integrated layer stack 500 between the vacuum environment from one chamber, e.g., chamber 200, to the vacuum environment of a second chamber, e.g., chamber 300, while maintaining vacuum pressures and without exposing the integrated layer stack 500 to an ambient environment. In the ambient environment, the integrated layer stack 500 may be exposed to mechanical and chemical contaminants, such as particles, moisture, oxygen and the like, that may damage the dielectric layer structure being fabricated and possibly form an undesired interfacial layer, e.g., native oxide, between each layer while transferring. Therefore, performing the method 400 in the processing system 800 without breaking vacuum advantageously: (i) minimizes the queue times for the integrated layer stack 500; and (ii) prevents oxidation of the interconnects 512 between the dry etching of block 402 and the liner 520 deposition of block 404, and prevents oxidation of the liner 520 between liner deposition of block 404 and the layer stack deposition in the air gap structure formation of block 406.

While the foregoing is directed to embodiments of the present disclosure, other and further embodiments may be devised without departing from the basic scope thereof, and the scope thereof is determined by the claims that follow.

The invention claimed is:

1. A method for forming an air gap structure in an integrated layer stack, comprising:
    dry etching a mold layer disposed on the integrated layer stack in a processing system under vacuum, wherein the mold layer is disposed between one or more copper interconnects and the dry etching of the mold layer exposes at least a portion of the one or more copper interconnects; and
    depositing a conformal liner layer over the portion of the one or more copper interconnects exposed by the dry etching, wherein the dry etching and the depositing the conformal liner layer are performed in the processing system without breaking vacuum.

2. The method of claim 1, further comprising:
    depositing a layer stack over the one or more copper interconnects under vacuum, wherein the layer stack includes a first flowable low-k material layer, a sacrificial film layer, and a second flowable low-k material layer, and wherein depositing the layer stack is performed in the processing system without breaking vacuum.

3. The method of claim 1, further comprising:
    depositing a layer stack over the one or more copper interconnects under vacuum, wherein the layer stack includes a sacrificial film layer and a flowable low-k material layer, and wherein depositing the layer stack is performed in the processing system without breaking vacuum.

4. The method of claim 2, further comprising:
    curing the layer stack to remove the sacrificial film layer and form the air gap structure.

5. The method of claim 3, further comprising:
curing the layer stack to remove the sacrificial film layer and form an air gap structure.

6. The method of claim 1, wherein the mold layer is a silicon-based oxide or a low-K material.

7. The method of claim 1, wherein the conformal liner layer comprises a dielectric material selected from the group consisting of carbide, nitride and silane.

8. The method of claim 2, wherein the first and second flowable low-k material layer are comprised of carbon doped oxides, fluorinated carbon, nano clustering silica, mesoporous oxides, or organic "spin-on" materials.

9. The method of claim 2, wherein the sacrificial layer comprises carbon or a polymeric carbon-hydrogen material.

10. A method for forming an air gap structure in an integrated layer stack, comprising:
dry etching an oxide mold layer disposed on the integrated layer stack in a first processing chamber in a processing system under vacuum, wherein the oxide mold layer is disposed between one or more copper interconnects and the process of dry etching of the mold layer exposes at least a portion of one or more of the copper interconnects; and
forming a conformal low-k material liner layer disposed on the one or more copper interconnects by depositing a low-k material liner layer having a thickness of less than about 2 nanometers conformally over the exposed portion of the one or more copper interconnects in a second processing chamber in the processing system under vacuum, wherein the dry etching and the depositing the low-k material liner layer are performed in the processing system without breaking vacuum.

11. The method of claim 10, further comprising:
depositing a layer stack over the one or more copper interconnects in the second processing chamber in the processing system under vacuum, wherein the layer stack includes a first flowable low-k material layer, a sacrificial film layer, and a second flowable low-k material layer, and wherein the depositing the layer stack is performed in the processing system without breaking vacuum.

12. The method of claim 10, further comprising:
depositing a layer stack over the one or more copper interconnects under vacuum, wherein the layer stack includes a sacrificial film layer and a flowable low-k material layer, and wherein the depositing the layer stack is performed in the processing system without breaking vacuum.

13. The method of claim 10, wherein the conformal low-k material liner layer comprises silicon carbon nitride (SiCN) and the sacrificial film comprises carbon.

14. method of claim 11, further comprising:
curing the layer stack to remove the sacrificial film layer and form the air gap structure.

15. The method of claim 14, further comprising:
polishing a portion of the first flowable low-k material layer and the conformal low-k material liner layer to expose a top portion of the interconnect.

16. The method of claim 14, further comprising:
partially polishing a portion of the first flowable low-k material layer, wherein the conformal low-k material liner layer is not polished.

17. The method of claim 10, wherein the dry etching uses NF3, NH3 or CxFy gas at a pressure of about 2 mTorr to about 20 mTorr.

18. The method of claim 10, wherein the depositing a low-k material liner layer is performed using atomic layer deposition, chemical vapor deposition, hybrid-plasma chemical vapor deposition, plasma-enhanced chemical vapor deposition, plasma-enhanced atomic layer deposition, microwave assisted chemical vapor deposition or neutral beam enhanced chemical vapor deposition.

19. A method for forming a dielectric structure on a substrate in a processing system, comprising:
dry etching a mold layer on the substrate in a first processing chamber under vacuum, wherein the mold layer is disposed between one or more copper interconnects and the process of dry etching of the mold layer exposes at least a portion of one or more of the copper interconnects;
transferring the substrate from the first processing chamber to one or more second processing chambers under vacuum;
forming a conformal liner layer disposed on the one or more copper interconnects by depositing a liner layer conformally over the exposed portion of the one or more copper interconnects on the substrate in the one or more second processing chambers under vacuum; and
depositing one or more dielectric layers and a sacrificial layer on the liner layer formed on the substrate in the one or more second processing chambers under vacuum.

20. The method of claim 19, wherein the depositing a liner layer and depositing one or more dielectric layers are performed in separate second processing chambers.

* * * * *